US012676677B2

(12) United States Patent
Zhang et al.

(10) Patent No.: US 12,676,677 B2
(45) Date of Patent: Jul. 7, 2026

(54) LIGHT EMISSION ASSEMBLY AND AN OPTICAL MODULE

(71) Applicant: HISENSE BROADBAND MULTIMEDIA TECHNOLOGIES CO., LTD., Qingdao (CN)

(72) Inventors: Jiaao Zhang, Qingdao (CN); Xinnan Wang, Qingdao (CN); Lin Yu, Qingdao (CN); Jianwei Mu, Qingdao (CN)

(73) Assignee: HISENSE BROADBAND MULTIMEDIA TECHNOLOGIES CO., LTD., Qingdao (CN)

( * ) Notice: Subject to any disclaimer, the term of this patent is extended or adjusted under 35 U.S.C. 154(b) by 1044 days.

(21) Appl. No.: 17/853,742

(22) Filed: Jun. 29, 2022

(65) Prior Publication Data

US 2022/0337022 A1      Oct. 20, 2022

Related U.S. Application Data

(63) Continuation of application No. PCT/CN2021/103117, filed on Jun. 29, 2021.

(30) Foreign Application Priority Data

Dec. 18, 2020    (CN) .......................... 202011507499.7
Dec. 18, 2020    (CN) .......................... 202023086705.X

(51) Int. Cl.
H04B 10/50          (2013.01)
G02B 6/42           (2006.01)
          (Continued)

(52) U.S. Cl.
CPC ........... H04B 10/503 (2013.01); G02B 6/428 (2013.01); H01S 5/0239 (2021.01); H01S 5/042 (2013.01); H01S 5/4025 (2013.01); H01S 5/0265 (2013.01)

(58) Field of Classification Search
CPC ...... H01S 5/2039; G02B 6/428; G02B 6/4281
See application file for complete search history.

(56) References Cited

U.S. PATENT DOCUMENTS 6,057,954 A      5/2000  Parayanthal et al.
11,133,647 B2    9/2021  Yi et al.
          (Continued)

FOREIGN PATENT DOCUMENTS

CN          204906401 U      12/2015
CN          105610040 A       5/2016
          (Continued)

OTHER PUBLICATIONS

Notification on grant of patent right for invention from Chinese patent application No. 202011507499.7, dated Aug. 30, 2024.

*Primary Examiner* — Joshua King
(74) *Attorney, Agent, or Firm* — Harness, Dickey & Pierce, P.L.C.

(57) ABSTRACT

A light emission assembly including: a substrate; at least two channels including: a driving assembly including a driving chip; an EML laser assembly including an EML laser chip; a first magnetic bead; a second magnetic bead; a DC blocking capacitor; a driving multiplexing pad for electrically connecting a first end of the first magnetic bead with a signal pad of the driving chip and a first end of the DC blocking capacitor, a second end of the first magnetic bead being connected to a first supply voltage; an EML multiplexing pad for electrically connecting a first end of the second magnetic bead with the EML laser chip assembly and a second end of the DC blocking capacitor, a second end of the second magnetic bead being connected to a supply voltage of the EML laser chip. The present disclosure also provides an optical module including the light emission assembly.

8 Claims, 6 Drawing Sheets

(51) Int. Cl.

| | |
|---|---|
| *H01S 5/0239* | (2021.01) |
| *H01S 5/026* | (2006.01) |
| *H01S 5/042* | (2006.01) |
| *H01S 5/40* | (2006.01) |

(56) References Cited

U.S. PATENT DOCUMENTS

| | | | | |
|---|---|---|---|---|
| 2006/0092642 | A1 | 5/2006 | Nakata et al. | |
| 2009/0263140 | A1* | 10/2009 | Kagaya | H05K 1/0253 |
| | | | | 398/139 |
| 2013/0187561 | A1* | 7/2013 | Franck | H05B 45/46 |
| | | | | 315/201 |
| 2017/0059792 | A1 | 3/2017 | Luo et al. | |
| 2018/0160532 | A1* | 6/2018 | Tatsumi | H01S 5/0427 |
| 2020/0238605 | A1* | 7/2020 | Mitomo | B29C 64/135 |
| 2020/0313400 | A1* | 10/2020 | Kawanishi | H01S 5/0239 |
| 2021/0066885 | A1* | 3/2021 | Kuo | H01S 5/0608 |
| 2021/0167865 | A1* | 6/2021 | Yi | G02B 5/28 |
| 2021/0226413 | A1* | 7/2021 | Yi | H01S 5/02212 |
| 2021/0239925 | A1* | 8/2021 | Kagaya | H01S 5/0427 |
| 2021/0359488 | A1* | 11/2021 | Kagaya | G02F 1/0157 |
| 2022/0285910 | A1* | 9/2022 | Srowig | H01S 5/42 |

FOREIGN PATENT DOCUMENTS

| | | | | | |
|---|---|---|---|---|---|
| CN | 109417272 | A | * | 3/2019 | H01S 5/02212 |
| CN | 110178065 | A | | 8/2019 | |
| CN | 110780397 | A | | 2/2020 | |
| CN | 111522103 | A | | 8/2020 | |
| CN | 112505855 | A | | 3/2021 | |
| CN | 213780448 | U | | 7/2021 | |
| DE | 102020114782 | A1 | * | 7/2021 | H01S 5/0428 |
| DE | 102021101584 | B3 | * | 3/2022 | H01S 5/042 |
| JP | 2006220942 | A | | 8/2006 | |
| JP | 4892514 | B2 | * | 3/2012 | H05K 1/0224 |
| JP | 2016180779 | A | | 10/2016 | |
| WO | WO-2020133144 | A1 | * | 7/2020 | H01S 3/00 |
| WO | WO-2021085292 | A1 | * | 5/2021 | H05B 45/46 |

* cited by examiner

LIGHT EMISSION ASSEMBLY AND AN OPTICAL MODULE

CROSS-REFERENCE TO RELATED APPLICATION

The present disclosure is a continuation of PCT application PCT/CN2021/103117, filed Jun. 29, 2021, and claims priority to and the benefit of Chinese patent application No. 202011507499.7, entitled "AN OPTICAL MODULE", filed on Dec. 18, 2020, with the China National Intellectual Property Administration, and Chinese patent application No. 202023086705. X, entitled "AN OPTICAL MODULE", filed on Dec. 18, 2020, with the China National Intellectual Property Administration. The entire content of each of these applications is incorporated herein by reference.

FIELD OF THE PRESENT DISCLOSURE

The present disclosure relates to the field of optical communication technology, and more particularly to a light emission assembly and an optical module comprising the light emission assembly.

BACKGROUND OF THE PRESENT DISCLOSURE

A key aspect in optical fiber communication is conversion between optical signals and electrical signals. In optical fiber communication, an optical signal carrying various information is transmitted within an information transmission device such as an optical fiber/optical waveguide, wherein benefit from passive transmission properties of light in optical fiber/optical waveguide, a low-cost and low-loss transmission of information can be achieved. The optical signal needs to be converted to an electrical signal in order to be used by an information processing device such as a computer. In order to establish an information connection between the information transmission device such as an optical fiber/optical waveguide and the information processing device such as the computer, a mutual conversion between the electrical signal and the optical signal is needed.

In the field of optical fiber communication technology, optical modules are used to achieve mutual conversion between optical signals and electrical signals. The optical module achieves an electrical connection with an external upper computer via golden fingers on a circuit board within the optical module, wherein main electrical connections may include power supply, I2C signal transmission, data information transmission, grounding, and etc. The electrical connection realized by golden fingers has become the main connection mode in the optical module industry; based on this, a variety of industry protocols/specifications has been developed based on definition of pins on a golden finger.

SUMMARY OF THE PRESENT DISCLOSURE

An embodiment of the present disclosure provides light emission assembly configured to convert an electrical signal to an optical signal, including: a substrate for carrying devices; at least two channels carried by the substrate, wherein each channel includes: a driving assembly provided on a surface of the substrate, including a driving chip; an EML laser assembly provided on the surface of the substrate, including an EML laser chip; a first magnetic bead; a second magnetic bead; a DC blocking capacitor; a driving multiplexing pad provided on the surface of the substrate, configured to electrically connect a signal pad of the driving chip with a first end of the first magnetic bead, and to electrically connect said first end of the first magnetic bead to a first end of the DC blocking capacitor, wherein a second end of the first magnetic bead is connected to a first supply voltage; and an EML multiplexing pad provided on the surface of the substrate, configured to electrically connect the EML laser chip assembly with a first end of the second magnetic bead, and to electrically connect said first end of the second magnetic bead to a second end of the DC blocking capacitor, wherein a second end of the second magnetic bead is connected to a supply voltage of the EML laser chip.

An embodiment of the present disclosure further provides an optical module including the light emission assembly mentioned above and a circuit board.

DESCRIPTION OF THE EMBODIMENTS

The embodiments of the present disclosure will be described in conjunction with the accompanying drawings. Obviously, the described embodiments are only part of the embodiments of the present disclosure, but not all of the embodiments. All other embodiments obtained by a person skilled in the art based on the embodiments of the present disclosure without involving any inventive effort are within the scope of the present disclosure.

Figures 1, 2:
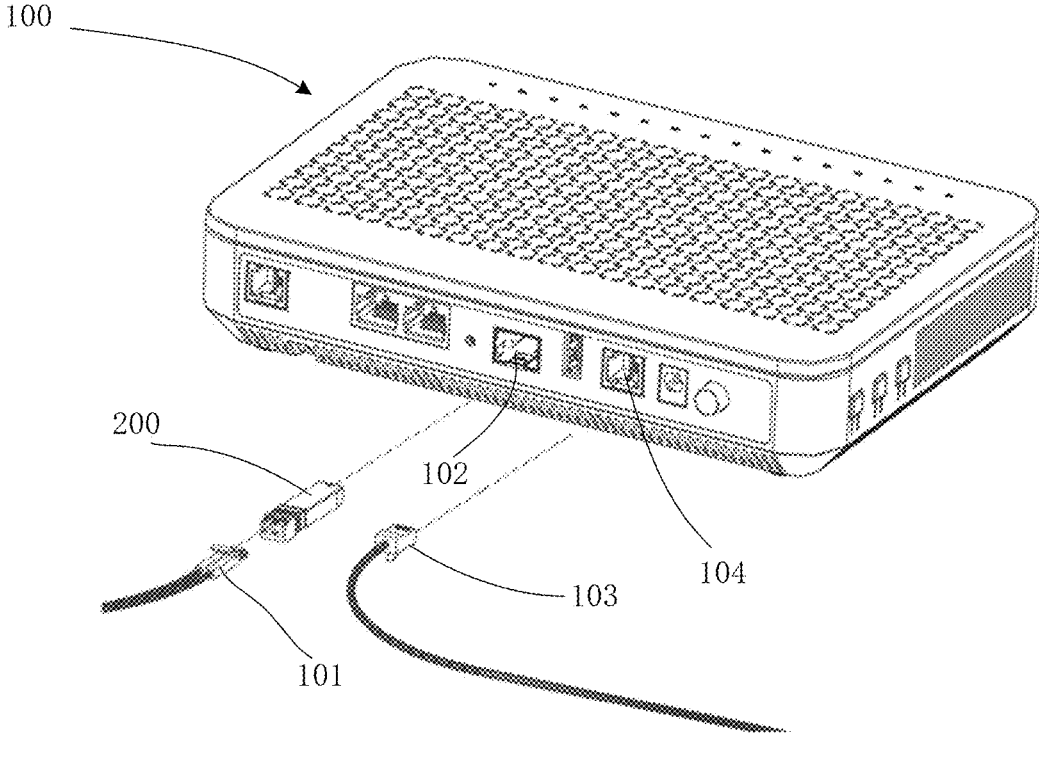
FIG. 1 is a schematic view showing a connection relationship of an optical communication terminal.
FIG. 2 is a schematic view of a structure of an optical network unit.

FIG. 1 is a schematic view showing a connection relationship of an optical communication terminal. As shown in FIG. 1, the connection of an optical communication terminal mainly includes the interconnection among an optical network terminal 100, an optical module 200, an optical fiber 101, and a network cable 103.

One end of the optical fiber 101 is connected to a remote server. One end of the network cable 103 is connected to a local information processing device. The connection between the local information processing device and the remote server is completed by the connection between the optical fiber 101 and the network cable 103. The connection between the optical fiber 101 and the network cable 103 is completed by the optical network terminal 100 having the optical module 200.

An optical port of the optical module 200 externally accesses the optical fiber 101, and establishes a bidirectional optical signal connection with the optical fiber 101. An electrical port of the optical module 200 externally accesses the optical network terminal 100, and establishes a bidirectional electrical signal connection with the optical network terminal 100. The mutual conversion between the optical signal and the electrical signal is achieved inside the optical module to establish an information connection between the optical fiber and the optical network terminal. In some embodiments of the present disclosure, the optical signal from the optical fiber is converted into an electrical signal by the optical module and input into the optical network terminal 100, and the electrical signal from the optical network terminal 100 is converted into an optical signal by the optical module and input into the optical fiber.

The optical network terminal has an optical module interface 102 configured for accessing the optical module 200 to establish a bidirectional electrical signal connection with the optical module 200. The optical network terminal has a network cable interface 104 configured for accessing the network cable 103 to establish a bidirectional electrical signal connection with the network cable 103. A connection is established between the optical module 200 and the network cable 103 via the optical network terminal 100. In some embodiments of the present disclosure, the optical network terminal transmits signals from the optical module to the network cable and transmits signals from the network cable to the optical module. The optical network terminal acts as an upper computer of the optical module to monitor the operation of the optical module.

The remote server establishes a bidirectional signal transmission channel with the local information processing device via the optical fiber, the optical module, the optical network terminal, and the network cable.

The common information processing device comprises a router, a switch, an electronic computer, and etc. The optical network terminal is an upper computer of the optical module, providing data signals to the optical module and receiving data signals from the optical module. A common upper computer of the optical module can also be an optical line terminal, etc.

FIG. 2 is a schematic view of the structure of an optical network terminal. As shown in FIG. 2, the optical network terminal 100 has a circuit board 105 therein, and a cage 106 is provided on the surface of the circuit board 105. An electrical connector is provided inside the cage 106, configured for accessing an electrical port of the optical module such as a golden finger, etc. The cage 106 is provided with a heat sink 107 having a protrusion such as a fin that increases the heat dissipating area.

The optical module 200 is inserted into the optical network terminal 100. In some embodiments of the present disclosure, the electrical port of the optical module is inserted into an electrical connector inside the cage 106, and the optical port of the optical module is connected to the optical fiber 101.

The cage 106 is located on the circuit board, and the electrical connector on the circuit board is wrapped in the cage such that the electrical connector is provided inside the cage. The optical module is inserted into the cage, so that the optical module is fixed by the cage. The heat generated by the optical module is conducted to the cage 106 and then diffused by the heat sink 107 on the cage.

Figure 3:
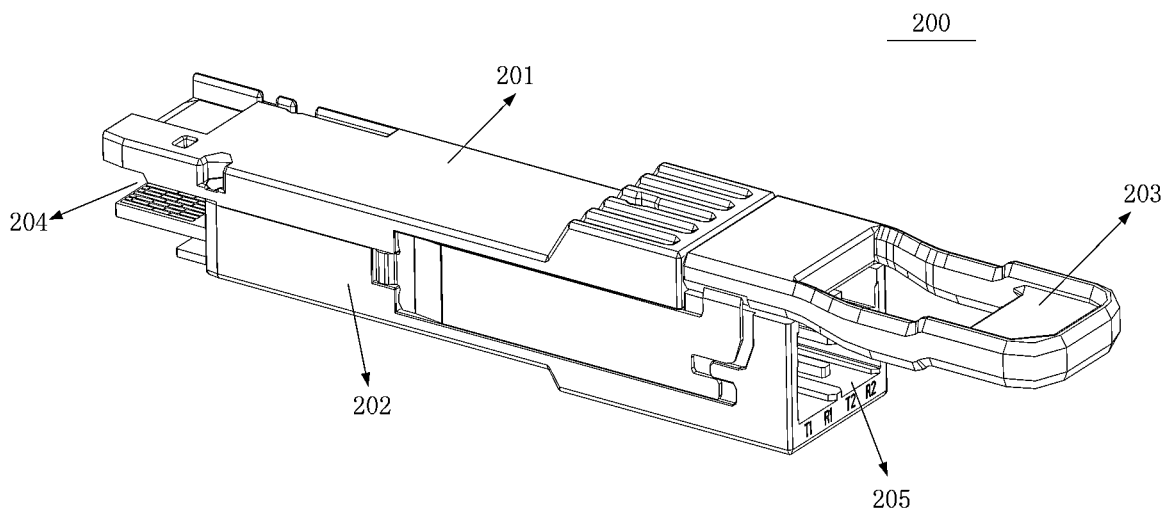
FIG. 3 is a schematic view of the structure of an optical module according to embodiments of the present disclosure.
Figure 4:
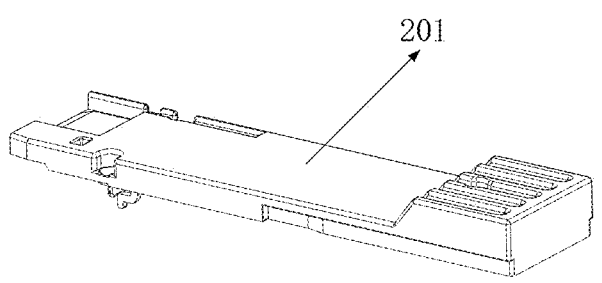
FIG. 4 is a schematic view of a breakdown structure of the optical module shown in FIG. 3.
Figure 4:
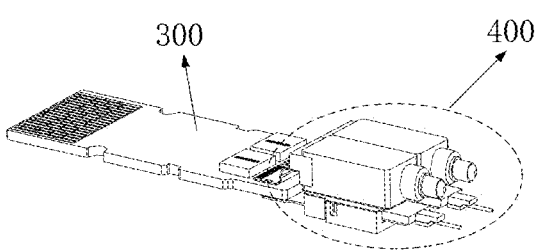
Figure 4:
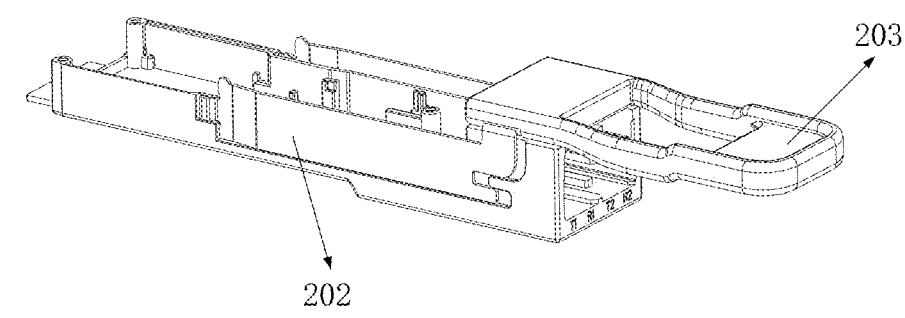

FIG. 3 is a schematic view of the structure of an optical module according to embodiments of the present disclosure. FIG. 4 is a schematic view of a breakdown structure of the optical module shown in FIG. 3. As shown in FIGS. 3 and 4, an embodiment of the present disclosure provides an optical module 200 including an upper housing 201, a lower housing 202, an unlocking component 203, a circuit board 300, and an optical transceiver assembly 400.

The upper housing 201 is covered and engaged on the lower housing 202 so as to form an enclosed chamber with two openings. The outer contour of the enclosed chamber generally takes the form of a rectangular body. In some embodiments of the present disclosure, the lower housing 202 includes a main plate, and two side plates provided to be perpendicular to the main plate and located on two sides of the main plate. The upper housing comprises a cover plate, and the cover plate is covered and engaged on two side plates of the upper housing to form the enclosed chamber. The upper housing may further comprise two side walls provided to be perpendicular to the cover plate and located on two sides of the cover plate, and the two side walls are engaged with the two side plates to make the upper housing 201 cover on the lower housing 202.

One of the two openings is an electrical port 204. A gold finger of the circuit board protrudes from the electrical port 204 and is inserted into an upper computer such as an optical network terminal. The other opening is an optical port 205, configured for accessing by an external optical fiber to connect the optical transceiver assembly 400 inside the optical module. Optoelectronic devices such as the circuit board 300, the optical transceiver assembly 400, etc. are located in the enclosed chamber.

The assembling mode for engaging the upper housing with the lower housing is used to facilitate mounting devices such as the circuit board 300 and the optical transceiver assembly 400 into the housing, and the upper housing and the lower housing form a packaged protective housing of the outermost layer of the module. The upper housing and the lower housing are generally made of a metal material to achieve electromagnetic shielding and heat dissipation. The housing of the optical module is generally not made into an integral component. If doing so, the positioning component, the heat dissipation component, and the electromagnetic shielding component cannot be mounted when assembling devices such as the circuit board, and it is not conducive to production automation.

The unlocking component 203 is located on the outer wall of the enclosed chamber/lower housing 202, configured for establishing the fixed connection between the optical module and the upper computer or releasing the fixed connection between the optical module and the upper computer.

The unlocking component 203 has an engaging component matched with the cage of the upper computer. Pulling the end of the unlocking component may relatively move the unlocking component on the surface of the outer wall. The optical module is inserted into the cage of the upper computer, and the optical module is fixed in the cage of the upper computer by an engaging portion of the unlocking component. By pulling the unlocking component, the engaging portion of the unlocking component moves along with it, thereby changing the connection relationship between the engaging portion and the upper computer to release the engaging relationship between the optical module and the upper computer, so that the optical module can be drawn out of the cage of the upper computer.

Circuit trace, electronic elements (such as a capacitor, a resistor, a triode, and a MOS tube) and chips (such as an MCU, a laser driving chip, a limiting amplifier chip, a clock data recovery CDR, a power management chip, and a data processing chip DSP), etc. are provided on the circuit board 300.

The circuit board 300 connects the electrical devices in the optical module together according to a circuit design through the circuit trace so as to realize electrical functions such as power supply, electrical signal transmission, and grounding, etc.

The circuit board is generally a rigid circuit board. The rigid circuit board can also achieve a load-bearing function due to its relatively hard material, for example, the rigid circuit board can stably bear a chip. When the optical transceiver assembly is located on the circuit board, the rigid circuit board can also provide a stable load-bearing. The rigid circuit board can also be inserted into an electrical connector in the cage of the upper computer. In some embodiments of the present disclosure, a metal pin/gold finger is formed on an end surface at one side of the rigid circuit board, configured for connecting with the electrical connector. These are inconvenient to implement with a flexible circuit board.

A flexible circuit board is also used in some optical modules as a supplement to the rigid circuit board. The flexible circuit board is generally used in cooperation with the rigid circuit board, for example, a flexible circuit board connection can be used between the rigid circuit board and the optical transceiver assembly.

Figure 5:
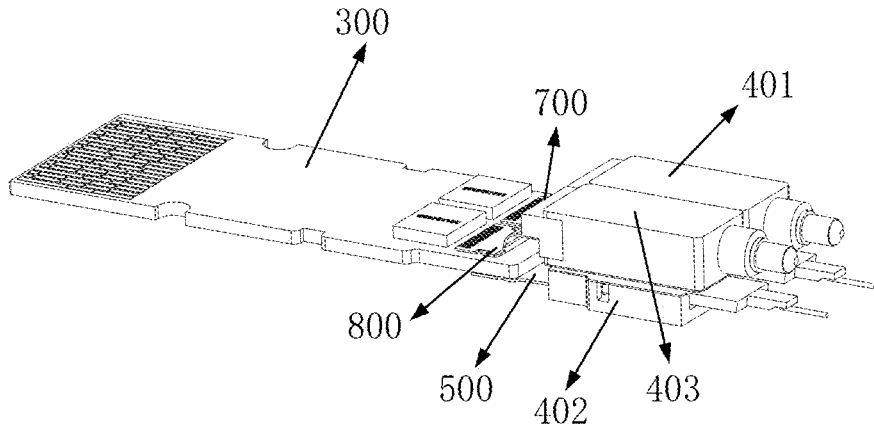
FIG. 5 is a schematic view of the structure of a circuit board according to embodiments of the present disclosure.
Figure 6:
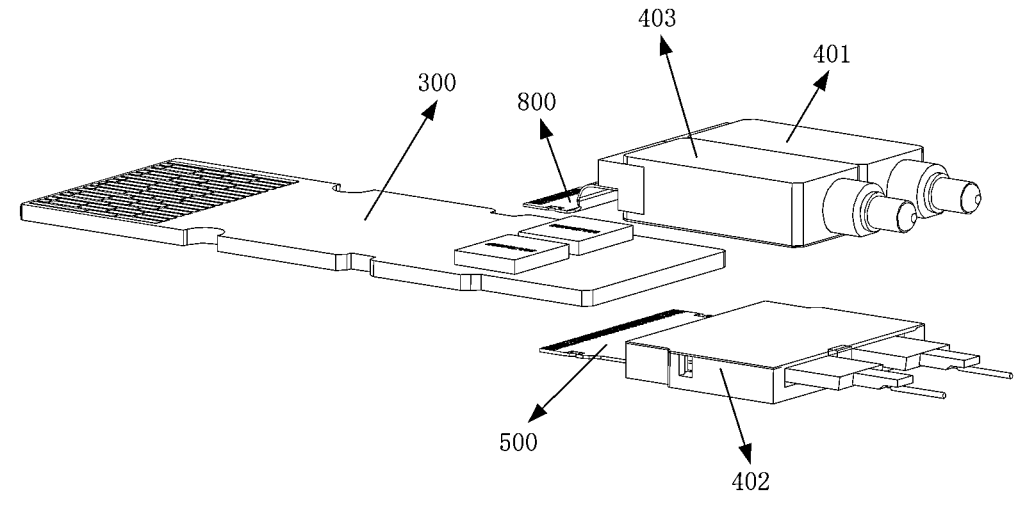
FIG. 6 is a schematic view of a breakdown structure of the circuit board shown in FIG. 5.

The optical transceiver assembly comprises two parts, i.e., a light emission assembly and a light receiving assembly, which are respectively configured for transmitting an optical signal and receiving an optical signal. FIG. 5 is a schematic view of the structure of a circuit board 300 according to embodiments of the present disclosure, and FIG. 6 is a schematic view of a breakdown structure of the circuit board 300 shown in FIG. 5. As shown in FIGS. 5 and 6, the optical module 200 comprises at least two light emission assemblies 401, 403 and a light receiving assembly 402. However, the optical transmitting component and the optical receiving component are not limited to the numbers shown in the figures. The two light emission assemblies 401, 403 are electrically connected to the circuit board 300 via a first flexible plate, respectively. The light receiving assembly 402 is electrically connected to the circuit board 300 via a second flexible plate 500. The light emission assemblies 401, 403 and the light receiving assembly 402 are arranged in a stacked manner, instead of arranging both the light emission assembly and the light receiving assembly on the surface of the circuit board 300. In this way, the space requirement for the circuit board 300 may not be increased, the volume size of the optical module may be reduced and a miniaturized package of the optical module is achieved.

In an example, the at least two light emission assemblies may comprise a first light emission assembly 401 and a second light emission assembly 403. The first light emission assembly 401 is electrically connected to the circuit board 300 via a first flexible plate 700, and the second light emission assembly 403 is electrically connected to the circuit board 300 via a third flexible plate 800, so as to realize the layout of multipath light-emitting chips.

The light emission assembly generally comprises a housing, an optical emitter, and a lens assembly. The optical emitter is fixed inside the housing for emitting a light beam. The lens assembly is positioned on the light-emitting path of the optical emitter and is fixed inside the housing for changing the transmission direction of the light beam so that the laser light beam enters the external optical fiber. That is, the light emitted from the optical emitter enter the optical fiber after being reflected by the lens assembly.

Figure 7:
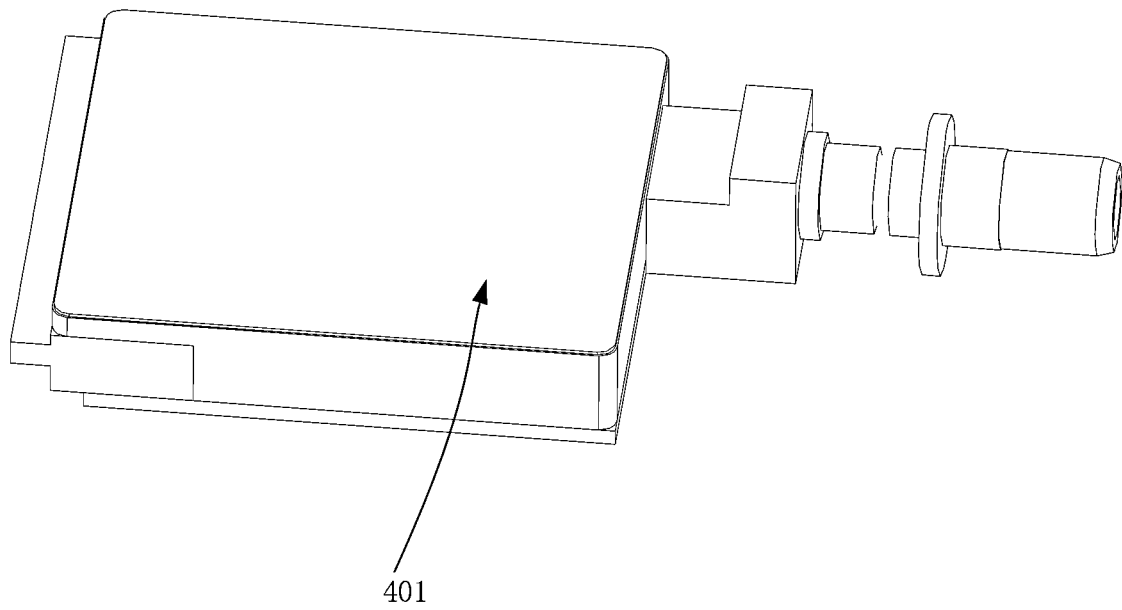
FIG. 7 is a schematic view showing an appearance structure of a light emission assembly according to embodiments of the present disclosure.
Figure 8:
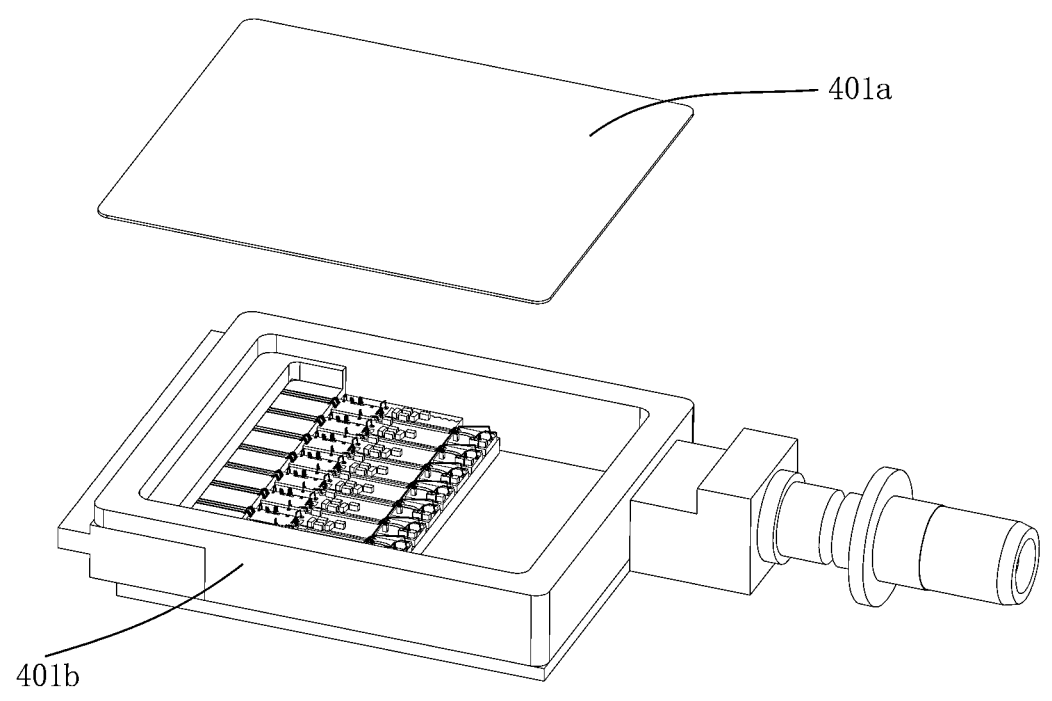
FIG. 8 is a schematic view of a breakdown structure of the light emission assembly shown in FIG. 7.

FIG. 7 is a schematic view showing an appearance structure of a light emission assembly according to embodiments of the present disclosure, and FIG. 8 is a schematic view of a breakdown structure of a light emission assembly shown in FIG. 7. As shown in FIGS. 7 and 8, the light emission assembly 401 provided by the present disclosure includes a cover plate 401*a* and a cavity 401*b*. The cover plate 401*a* and the cavity 401*b* are engaged to form a receiving space, and a ceramic substrate 601, a driving chip 602, a laser chip 603 and other structures are provided in the receiving space.

Figure 9:
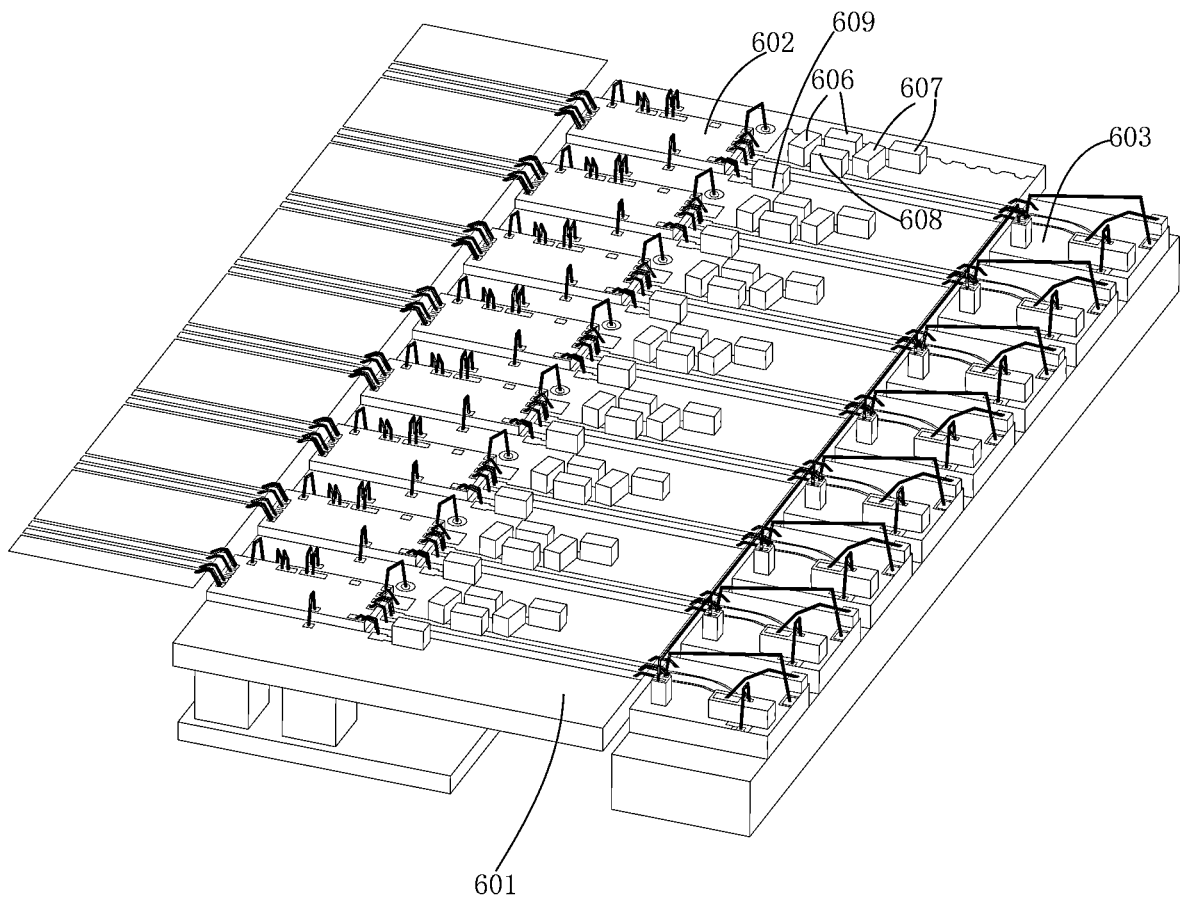
FIG. 9 is a schematic view showing the connection of internal components of a light emission assembly according to embodiments of the present disclosure.
Figure 10:
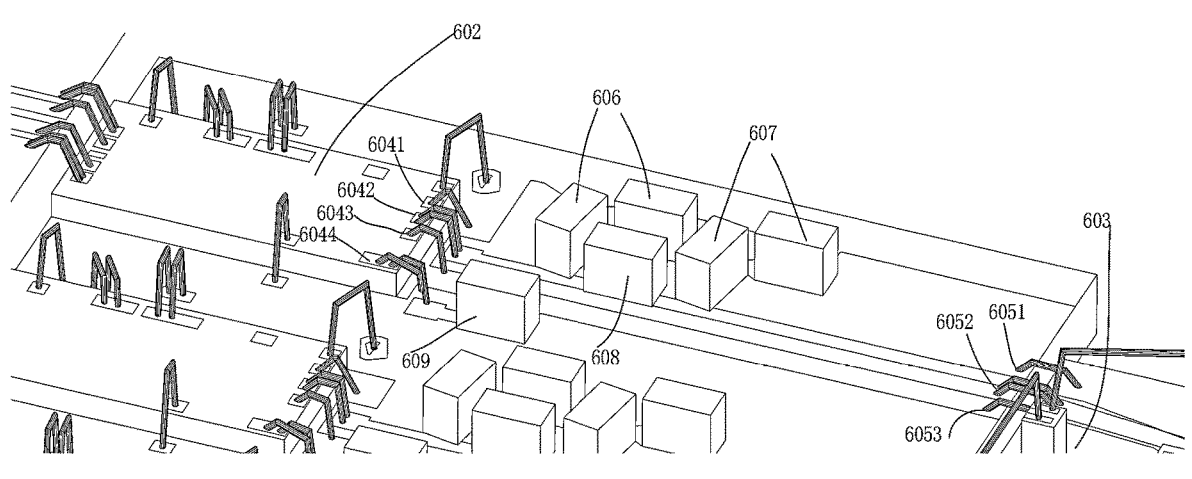
FIG. 10 is a partial view of the light emission assembly shown in FIG. 9.

FIG. 9 is a schematic view showing the connection of internal components of a light emission assembly according to embodiments of the present disclosure, and FIG. 10 is a partial view of the light emission assembly shown in FIG. 9. The light emission assembly shown in FIGS. 9 and 10 comprising a substrate and various devices such as driving chips, laser chips and etc. provided on the substrate. Multiple channels can be integrated on the substrate, each of which may comprise the same devices and have the same configuration. In the embodiment illustrated in FIG. 9, eight channels are integrated. However, the number of channels is not limited to this, for example, a single channel, dual channels, four channels, six channels or channels with other number may be provided.

The substrate of the light emission assembly is preferably a ceramic substrate, but it can also be other types of substrates, such as a glass substrate, a silicon substrate, or an organic sheet substrate. The laser is preferably an electro-absorption modulated laser (EML laser) or other types of lasers, such as distributed feedback semiconductor laser (DFB laser). The EML laser integrates an electro-absorption modulator and a DFB laser, including an electro-absorption modulated region and a light emission region, which are realized by the electro-absorption modulator and the DFB laser, respectively.

The structures are illustrated in detail below in conjunction with FIGS. 9 and 10.

In an embodiment of the present disclosure, the surface of the ceramic substrate 601 is provided with a driving assembly. The driving assembly includes a driving chip 602 and a first substrate. The first substrate is provided with a positive electrode connection area and a negative electrode connection area. The positive electrode of the driving chip 602 is electrically connected to the positive electrode connection area, and the negative electrode is electrically connected to the negative electrode connection area.

A driving multiplexing pad 6042 and a driving power supply pad 6044 are provided near the driving chip 602. The driving multiplexing pad 6042 is configured for electrically connecting a signal pad of the driving chip 602 with one end of a first magnetic bead 606, and the other end of the first magnetic bead 606 is connected to a first voltage. The driving multiplexing pad 6042 is also configured for electrically connecting one end of a DC blocking capacitor 608 to one end of the first bead 606.

The driving multiplexing pad 6042 mainly integrates the functions of supplying power and transmitting signals to the EML laser chip 603. The driving multiplexing pad 6042 can provide a first voltage for the driving chip 602, and the driving power supply pad 6044 can provide a second voltage for the driving chip 602. The first voltage and the second voltage are different in voltage value, and can provide different voltages for the driving chip 602 to ensure the normal operation.

In some embodiments of the present disclosure, the positive electrode of the driving chip 602 is electrically connected to the positive electrode connection area on the first substrate, and the positive electrode connection area is connected to the driving multiplexing pad 6042 by wire bonding. The driving multiplexing pad 6042 is electrically connected to the first magnetic bead 606, and the first magnetic bead 606 is electrically connected to the power supply pin on the circuit board 300. Therefore, the voltage on the power supply pin is transmitted to the driving chip 602 via the first magnetic bead 606 and the driving multiplexing pad 6042 to provide the first voltage for the driving chip 602.

The positive electrode of the driving chip 602 may be electrically connected to to a filter capacitor. To be illustrative, the positive electrode of the driving chip 602 is electrically connected to the positive electrode connection area on the first substrate, and the positive electrode connection area is connected to the driving multiplexing pad 6042 by wire bonding. The driving multiplexing pad 6042 is electrically connected to a filter capacitor 609, and the filter capacitor 609 is electrically connected to the power supply pin on the circuit board 300. Therefore, the voltage on the power supply pin is transmitted to the driving chip 602 via the filter capacitor 609 and the driving multiplexing pad 6042, so as to provide a second voltage for the driving chip 602 with a voltage value different from the first voltage.

An EML laser assembly is further provided on the surface of the ceramic substrate 601. The EML laser assembly comprises an EML laser chip 603 and a second substrate. A positive electrode connection area and a negative electrode connection area are also provided on the second substrate. The positive electrode of the EML laser chip 603 is electrically connected to the positive electrode connection area, and the negative electrode is electrically connected to the negative electrode connection area.

An EML multiplexing pad 6052 is arranged near the EML laser chip 603. The EML multiplexing pad 6052 is configured for electrically connecting the other end of the DC blocking capacitor 608 with the other end of the second magnetic bead 607, and it is also configured for electrically connecting the EML laser assembly and the other end of the second magnetic bead 607. One end of the second magnetic bead 607 is connected to the supply voltage of the EML laser chip 603.

The EML multiplexing pad 6052 is used to provide voltage to the EML laser chip 603 and to receive a driving signal from the driving chip 602. In some embodiments of the present disclosure, the positive electrode of the EML laser chip 603 is electrically connected to the positive electrode connection area on the second substrate, and the positive electrode connection area is connected to the EML multiplexing pad 6052 by wire bonding. The EML multiplexing pad 6052 is electrically connected to the second magnetic bead 607, and the second magnetic bead 607 is electrically connected to the power supply pin on the circuit board 300. Therefore, the voltage on the power supply pin is transmitted to the EML laser chip 603 via the second magnetic beads 607 and the EML multiplexing pad 6052, so as to provide a voltage for the EML laser chip 603.

The positive electrode of the driving chip 602 is electrically connected to the positive electrode connection area on the first substrate, and the positive electrode connection area is connected to the driving multiplexing pad 6042 by wire bonding. The driving multiplexing pad 6042 is electrically connected to one end of the DC blocking capacitor 608, and the other end of the DC blocking capacitor 608 is electrically connected to the EML multiplexing pad 6052. The EML multiplexing pad 6052 is electrically connected to the positive electrode connection area of the second substrate, and the positive electrode connection area of the second substrate is electrically connected to the positive electrode of the EML laser chip 603. In this way, driving signals generated by the driving chip 602 are transmitted to the EML laser chip 603, and the EML laser chip 603 performs a normal operation according to the driving signals.

Taking the left-right direction in FIG. 7 as an example, the driving multiplexing pad 6042 enables the driving chip 602 to deliver a driving signal to the right on one hand, and provides a voltage to the driving chip 602 to the left on the other hand, and the two branches work in opposite directions and in parallel.

The EML multiplexing pad 6052 receives signals from the driving chip 602, and provides a voltage to the right for the EML laser chip 603 at the same time, and the two branches operate in parallel.

In the embodiments of the present disclosure, one end of the filter capacitor 609 is electrically connected to the power supply pin on the circuit board 300, and the other end of which is grounded.

In the embodiments of the present disclosure, one end of the first magnetic bead 606 is electrically connected to the power supply pin on the circuit board 300, and the other end is electrically connected to the DC blocking capacitor 608. One end of the second magnetic bead 607 is electrically connected to the power supply pin on the circuit board 300, and the other end is electrically connected to the DC blocking capacitor 608.

Taking the left-right direction in FIG. 7 as an example, the driving chip 602 is located on the left side, and the EML laser chip 603 is located on the right side. The direction in which the first magnetic bead transmits a voltage is to transmit to the left to provide a voltage for the driving chip 602, and the direction in which the second magnetic bead transmits a voltage is to transmit to the right to provide a voltage for the EML laser chip 603. In order to avoid current interference with each other, the first magnetic bead 606 and the second magnetic bead 607 are both electrically connected to the DC blocking capacitor 608. The function of the DC blocking capacitor 608 is to block direct current (DC), so as to avoid the interference of the current flowing through the first magnetic bead 606 and the second magnetic bead 607.

In the embodiments of the present disclosure, the surface of the ceramic substrate 601 is further provided with a first grounding pad 6041, which is arranged adjacent to the driving chip 602 and is configured for electrically connecting the negative electrode of the driving chip 602 and the ceramic substrate 601 so as to realize the grounding of the negative electrode of the driving chip 602. In some embodiments of the present disclosure, the negative electrode of the driving chip 602 is electrically connected to the negative electrode connection area of the first substrate, and the negative electrode connection area of the first substrate is connected to the first grounding pad 6041 by wire bonding. The first grounding pad 6041 is wire-bonded to the ceramic substrate 601, and the ceramic substrate 601 is electrically connected to the grounding pin on the circuit board 300 so as to realize the grounding of the negative electrode of the driving chip 602.

The second grounding pad 6043 is arranged adjacent to the driving chip 602, and configured for electrically connecting the negative electrode of the driving chip 602 with the negative electrode of the EML laser chip to achieve the isolation between the channels. In some embodiments of the present disclosure, the negative electrode of the driving chip 602 is connected to the second grounding pad 6043 by wire bonding, and the second grounding pad 6043 is electrically connected to the fourth grounding pad 6053. The fourth grounding pad 6053 is connected to the negative electrode connection area of the second substrate, and the negative electrode connection area of the second substrate is electrically connected to the EML laser chip 603. In this way, the negative electrode of the driving chip 602 is electrically connected to the EML laser chip 603 to achieve isolation between the channels.

The third grounding pad 6051 is arranged adjacent to the EML laser chip 603, and is configured for electrically connecting the negative electrode of the EML laser chip 603 and the ceramic substrate so as to ground the negative electrode of the EML laser chip. In some embodiments of the present disclosure, the negative electrode of the EML laser chip 603 is electrically connected to the negative electrode connection area of the second substrate, and the negative electrode connection area of the second substrate is connected to the third grounding pad 6051 by wire bonding. The third grounding pad 6051 is wire-bonded to the ceramic substrate 601, and the ceramic substrate 601 is electrically connected to the ground pin on the circuit board 300 so as to achieve the grounding of the negative electrode of the driving chip 602.

Figure 11:
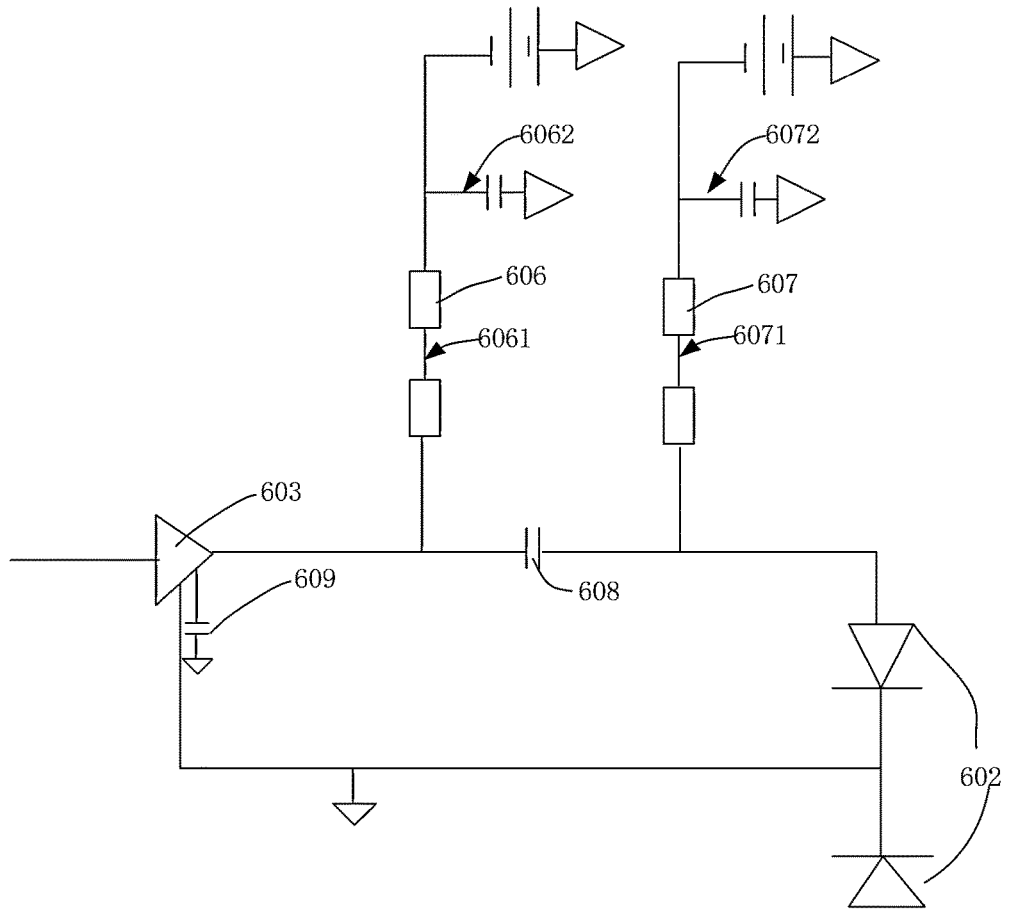
FIG. 11 is a schematic view of an equivalent circuit illustrating connection of components in a light emission assembly according to embodiments of the present disclosure.

FIG. 11 is a schematic view of an equivalent circuit illustrating connection of components in a light emission assembly according to embodiments of the present disclosure. As shown in FIG. 11, the peripheral circuit of the driving chip 602 includes a first branch 6061 connected in series with the power line and a second branch 6062 connected in parallel with the power line. The first branch includes a first magnetic bead 606, providing the first voltage for the driving chip 602 via the first magnetic bead 606. The peripheral circuit of the EML laser chip 603 includes a third branch 6071 connected in series with the power line and a fourth branch 6072 connected in parallel with the power line. The third branch 6071 has a second magnetic bead 607, providing the voltage for the EML laser chip 603 via the second magnetic bead 607. The DC blocking capacitor 608 is used to block the direct current between the peripheral circuit of the driving chip 602 and the peripheral circuit of the EML laser chip 603, ensuring that the voltage between the peripheral circuit of the driving chip 602 and the peripheral circuit of the EML laser chip 603 does not interfere with each other.

The present disclosure provides an optical module, comprising a circuit board and a light emission assembly. The light emission assembly comprises a ceramic substrate. The surface of the ceramic substrate carries at least two channels, and adjacent channels are shielded and isolated therebetween. Each channel comprises a driving chip, an EML laser driving chip, a driving multiplexing pad, a driving power supply pad, and an EML multiplexing pad. The driving multiplexing pad is arranged near the driving chip to ensure the normal operation of the driving chip. The main function of the driving multiplexing pad is to provide a first voltage to the driving chip and transmit signals to the EML laser chip. The main function of the driving power supply pad is to supply a second voltage to the driving chip. The main function of the EML multiplexing pad is to supply a voltage to the EML laser chip and to ensure that the EML laser chip receives signals from the driving chip.

In some embodiments of the present disclosure, the connecting mode between the devices is as follows:

one end of the driving chip is electrically connected to the driving multiplexing pad, the driving multiplexing pad is electrically connected to the first magnetic bead, the first magnetic bead is electrically connected to the power supply pin on the circuit board so as to provide a first voltage for the driving chip, one end of the driving chip is electrically connected to the driving multiplexing pad, the driving multiplexing pad is electrically connected to the DC blocking capacitor, and the DC blocking capacitor is electrically connected to the EML multiplexing pad so as to achieve the communication between the driving chip and the EML laser chip;

one end of the driving chip is electrically connected to one end of the driving power supply pad, the other end of the driving power supply pad is electrically connected to one end of the filter capacitor, and the other end of the filter capacitor is electrically connected to the power supply pin on the circuit board so as to input a second voltage to the driving chip;

the EML multiplexing pad provides a voltage to the EML laser chip via a connection to a second magnetic bead, and receives signals from the driving chip via the connection to a DC blocking capacitor.

Through the above configuration, a driving peripheral circuit and an EML peripheral circuit with multi-channels can be arranged on the ceramic substrate, which ensures the normal operation of the driving chip and the EML laser chip.

Embodiments of the present disclosure have been disclosed for the purpose of illustration. It may be understood by the person skilled in the art that various modifications, additions, and substitutions may be made thereto without departing from the spirit and scope of the present disclosure and the appended claims.

What is claimed is:

1. A light emission assembly configured to convert an electrical signal to an optical signal, comprising:
   a substrate;
   at least two channels carried by the substrate, wherein each channel comprises:
   a driving assembly provided on a surface of the substrate, comprising a driving chip;
   an EML laser assembly provided on the surface of the substrate, comprising an EML laser chip;
   a first magnetic bead;
   a second magnetic bead;
   a DC blocking capacitor;
   a filter capacitor;
   a driving multiplexing pad provided on the surface of the substrate, configured to electrically connect a signal pad of the driving chip with a first end of the first magnetic bead, and to electrically connect said first end of the first magnetic bead to a first end of the DC blocking capacitor, wherein a second end of the first magnetic bead is connected to a power supply pin of a circuit board to provide a first supply voltage to the driving chip;
   a driving power supply pad provided on the surface of the substrate, configured for electrically connecting a positive electrode of the driving chip with a first end of the filter capacitor, wherein a second end of the filter capacitor is connected to power supply pin of the circuit board to provide a second supply voltage different from the first supply voltage to the driving chip;

a first grounding pad of the driving chip provided adjacent to the driving chip, configured for electrically connecting a negative electrode of the driving chip and the substrate to realize grounding of the negative electrode of the driving chip; and a second grounding pad of the driving chip provided adjacent to the driving chip, configured for electrically connecting the negative electrode of the driving chip and a negative electrode of the EML laser chip to achieve isolation between channels;

an EML multiplexing pad provided on the surface of the substrate, configured to electrically connect the EML laser chip assembly with a first end of the second magnetic bead, and to electrically connect said first end the second magnetic bead to a second end of the DC blocking capacitor, wherein a second end of the second magnetic bead is connected to a supply voltage of the EML laser chip;

wherein a first end of the driving power supply pad is electrically connected to a first end of the filter capacitor, and a second end of the driving power supply pad is electrically connected to a positive electrode of the driving chip; and wherein a second end of the filter capacitor is electrically connected to power supply pin of the circuit board to provide the second voltage to the driving chip.

2. The light emission assembly according to claim 1, wherein the channel further comprises:

a third grounding pad of the EML laser chip provided adjacent to the EML laser chip, configured for electrically connecting a negative electrode of the EML laser chip with the substrate to realize grounding of the negative electrode of the EML laser chip; and a fourth grounding pad of the EML laser chip provided adjacent to the EML laser chip, configured for electrically connecting the negative electrode of the EML laser chip with a negative electrode of the driving chip to achieve isolation between channels.

3. The light emission assembly according to claim 1, wherein a first end of the filter capacitor is electrically connected to a power supply pin of the circuit board, and a second end of the filter capacitor is grounded.

4. The light emission assembly according to claim 1, wherein the second end of the first magnetic bead is electrically connected to a power supply pin of a circuit board, and the second end of the second magnetic bead is electrically connected to the power supply pin of the circuit board.

5. The light emission assembly according to claim 1, wherein a first end of the driving multiplexing pad is electrically connected to the driving chip, and a second end of the driving multiplexing pad is electrically connected to the first end of the first magnetic bead; and wherein the second end of the first magnetic bead is electrically connected to a power supply pin of a circuit board so as to provide a first voltage to the driving chip.

6. The light emission assembly according to claim 1, wherein a first end of the driving multiplexing pad is electrically connected to the driving chip, and a second end of the driving multiplexing pad is electrically connected to the first end of the DC blocking capacitor; and wherein the second end of the DC blocking capacitor is connected to the EML multiplexing pad, and the EML multiplexing pad is electrically connected to the EML laser chip for transmitting signals between the driving chip and the EML laser chip.

7. The light emission assembly according to claim 1, wherein a first end of the EML multiplexing pad is electrically connected to the EML laser chip, and a second end of the EML multiplexing pad is electrically connected to the first end of the second magnetic bead; and wherein the second end of the second magnetic bead is electrically connected to a power supply pin of a circuit board for providing a voltage to the EML laser chip.

8. An optical module, comprising:
a circuit board; and
a light emission assembly according to claim 1;
wherein the light emission assembly is electrically connected to the circuit board.

* * * * *